United States Patent
Zhang et al.

(10) Patent No.: US 12,313,716 B2
(45) Date of Patent: May 27, 2025

(54) METHOD AND SYSTEM FOR SIMULATING MAGNETIC RESONANCE ECHO-PLANAR IMAGING ARTIFACT

(71) Applicant: ZHEJIANG LAB, Hangzhou (CN)

(72) Inventors: Yu Zhang, Hangzhou (CN); Zhichao Wang, Hangzhou (CN); Chaoliang Sun, Hangzhou (CN); Huan Zhang, Hangzhou (CN); Haotian Qian, Hangzhou (CN); Junyang Zhang, Hangzhou (CN); Tianzi Jiang, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 0 days.

(21) Appl. No.: 18/796,233

(22) Filed: Aug. 6, 2024

(65) Prior Publication Data
US 2024/0393417 A1  Nov. 28, 2024

Related U.S. Application Data

(63) Continuation of application No. PCT/CN2023/124933, filed on Oct. 17, 2023.

(30) Foreign Application Priority Data

Oct. 19, 2022  (CN) .......................... 202211276165.2

(51) Int. Cl.
*G01V 3/00* (2006.01)
*G01R 33/56* (2006.01)
(Continued)

(52) U.S. Cl.
CPC ..... *G01R 33/5616* (2013.01); *G01R 33/5608* (2013.01); *G01R 33/56545* (2013.01)

(58) Field of Classification Search
CPC ............ G01R 33/5616; G01R 33/5608; G01R 33/56545
(Continued)

(56) References Cited

U.S. PATENT DOCUMENTS

| 5,869,965 | A  | 2/1999 | Du et al. |
| 6,700,374 | B1 | 3/2004 | Wu et al. |

(Continued)

FOREIGN PATENT DOCUMENTS

| CN | 101153896 A | 4/2008 |
| CN | 101515028 A | 8/2009 |

(Continued)

OTHER PUBLICATIONS

International Search Report (PCT/CN2023/124933); Date of Mailing: Jan. 17, 2024.

(Continued)

*Primary Examiner* — Walter L Lindsay, Jr.
*Assistant Examiner* — Frederick Wenderoth
(74) *Attorney, Agent, or Firm* — Wiersch Law Group

(57) ABSTRACT

A method and a system for simulating magnetic resonance echo-planar imaging artifacts. Firstly, for K-space artifacts, K-space data are restored through normal magnetic resonance images, and the K-space data are modified pertinently, and then images with artifacts are reconstructed; for susceptibility artifacts, a susceptibility model is constructed (Continued)

through normal magnetic resonance images, and the magnetic field distribution is reconstructed, and then the images with distortion artifacts are reconstructed. According to the present disclosure, a large number of artifact data sets with different artifact types and artifact degrees can be quickly created through a small number of normal images, thus laying a foundation for the research of identifying artifacts, eliminating or weakening artifacts. A simulation algorithm is designed according to the principle of generation of EPI sequence artifacts, and the obtained images such as stripe artifacts, Moer artifacts, Nyquist artifacts, susceptibility artifacts and the like have good scientificity, accuracy and interpretability.

6 Claims, 2 Drawing Sheets

(51) Int. Cl.
*G01R 33/561* (2006.01)
*G01R 33/565* (2006.01)

(58) Field of Classification Search
USPC .......................................................... 324/309
See application file for complete search history.

(56) References Cited

U.S. PATENT DOCUMENTS

| | | |
|---|---|---|
| 2002/0167315 A1 | 11/2002 | Kellman et al. |
| 2005/0049683 A1 | 3/2005 | Gray et al. |
| 2008/0175458 A1 | 7/2008 | Guo et al. |
| 2013/0134977 A1 | 5/2013 | Iwadate |
| 2013/0182932 A1 | 7/2013 | Chen et al. |
| 2014/0056497 A1 | 2/2014 | Hsieh et al. |
| 2015/0010125 A1 | 1/2015 | Sheng et al. |
| 2020/0305806 A1 | 10/2020 | Tang et al. |

FOREIGN PATENT DOCUMENTS

| | | | |
|---|---|---|---|
| CN | 103293498 A | | 9/2013 |
| CN | 103315739 A | | 9/2013 |
| CN | 108523890 A | | 9/2018 |
| CN | 109741409 A | * | 5/2019 |
| CN | 110095742 A | | 8/2019 |
| CN | 110390701 A | | 10/2019 |
| CN | 110652296 A | | 1/2020 |
| CN | 112489154 A | | 3/2021 |
| CN | 115100310 A | | 9/2022 |
| CN | 115359144 A | | 11/2022 |
| WO | 2015164825 A1 | | 10/2015 |
| WO | 2018184056 A1 | | 10/2018 |

OTHER PUBLICATIONS

Notice Of Allowance(CN202211276165.2); Date of Mailing: Jan. 5, 2023.
Analysis-of-magnetic-susceptibility-of-normal-brain-of-young-adults-by-quantitative-susceptibility-mapping.
Field-map-based-rectification-of-susceptibility-distortion-and-signal-compensation-in-diffusion-tensor-imaging.
Adaptive-Blocking-Artifacts-Reduction-Algorithm-Based-on-DCT-Domain.

* cited by examiner

METHOD AND SYSTEM FOR SIMULATING MAGNETIC RESONANCE ECHO-PLANAR IMAGING ARTIFACT

CROSS-REFERENCE TO RELATED APPLICATIONS

The present application is a continuation of International Application No. PCT/CN 2023/124933, filed on Oct. 17, 2023, which claims priority to Chinese Application No. 202211276165.2, filed on Oct. 19, 2022, the contents of both of which are incorporated herein by reference in their entireties.

TECHNICAL FIELD

The present disclosure relates to the technical field of magnetic resonance imaging, and in particular, to a method and a system for simulating magnetic resonance echo-planar imaging artifacts.

BACKGROUND

In the application of clinical medical imaging, artifacts often appear and can hardly be completely avoided. The same is true of magnetic resonance imaging artifacts, which means that some structures or signal intensity in magnetic resonance images are generated by imaging equipment or imaging technology rather than from the corresponding anatomical infrastructure in the imaging object. Such artifact information is likely to be misleading in the diagnosis of clinicians. Therefore, in order to avoid misdiagnosis, it is necessary to have the ability to identify artifact types according to artifact images. On the other hand, high-quality artifact image data sets are very important for finding ways to eliminate or weaken artifacts.

At present, various magnetic resonance imaging sequences are developed for the purpose of fast imaging, among which Echo-planar Imaging (EPI) is one of the fastest magnetic resonance imaging methods. It is widely used in magnetic resonance imaging of organs such as the brain and heart, and it plays an irreplaceable role in Diffusion Tensor Imaging (DTI), Functional Magnetic Resonance Imaging (fMRI), and other applications. Due to fast gradient switching and superb digital control acquisition technology, EPI sequences have the characteristic of fast scanning speed and insensitivity to motion. However, such imaging methods are extremely sensitive to abnormalities in the gradient field or main magnetic field, which is why the probability of artifacts produced by EPI sequences is much higher than other sequences in actual processes.

The following introduces the common artifacts of EPI sequence in several clinical magnetic resonance imaging systems.

In any magnetic resonance imaging system, it is inevitable to make mistakes in the conversion between analog signals and digital signals, because the number of analog-to-digital conversions required for imaging a patient is as high as tens of millions of times. It is more common that an error occurs when one of the data points is digitized. The reason for the digital error of single data points is often related to static electricity, especially in dry winter, electrostatic discharge is easy to occur. Secondly, the induced current caused by the wrong placement of the RF coil may further cause such problems. Magnetic resonance imaging artifacts caused by digital errors of singular data points in magnetic resonance K-space are called Stripe Artifacts.

In magnetic resonance imaging, the loss of one or more lines of data in the K-space can result in varying degrees of artifacts. Typically, the loss at the weakest phase coding step (the center of the K-space) will produce the largest artifact, which is called Moer Artifact. The causes of Moer artifacts are mainly caused by gradient instability and excessive receiver noise.

Due to the inhomogeneity of magnetic field, as well as factors such as eddy currents and chemical shifts generated by the rapid switching of gradients in EPI sequences, phase differences tend to accumulate between odd and even echoes in k-space, leading to artifacts in the phase encoding direction. When the sampling of the K-space data does not satisfy the Nyquist theorem, image aliasing will occur, which is called Nyquist Artifacts.

In the process of magnetic resonance imaging, adjacent tissues often have different susceptibility, and pathological changes to tissues, such as bleeding or tissue iron deposition, can cause uneven local magnetic field, resulting in overall uneven distribution of total magnetic field. In the EPI sequence, because the bandwidth of phase coding direction is very small, the image distortion will occur in the region with partial resonance effect (the region where the local magnetic field changes sharply). Such artifacts are called Susceptibility Artifacts.

Traditional artifact simulation often modifies the image subjectively according to the different manifestations of artifacts. However, this method often faces some problems, such as weak explanatory power, distorted simulation results and single simulation results, which makes the current artifact data set always in a low quality and quantity.

In order to better understand the generation mechanism of EPI sequence artifacts and the influences on medical clinical application and scientific research, and at the same time create a data set for further research on the restoration of artifact images in clinical or scientific research through a deep learning method, the present disclosure designs an algorithm for simulating various common EPI artifacts based on the principles of EPI sequence artifact generation, which can effectively simulate the most common above-mentioned artifacts under the hardware conditions of existing commonly used magnetic resonance equipment for EPI sequences.

SUMMARY

In view of the shortcomings of the prior art, the present disclosure provides a method and a system for simulating magnetic resonance echo-planar imaging artifacts.

The object of the present disclosure is achieved through the following technical solution: a method for simulating magnetic resonance echo-planar imaging artifacts, including the following steps:

Step 1, acquiring normal EPI sequence images without artifacts, including: scanning EPI sequences of an imaging target based on magnetic resonance imaging to obtain the normal EPI sequence images without artifacts.

Step 2, simulating K-space artifacts, including: restoring K-space data based on the normal EPI sequence images without artifacts, and modifying the K-space data for three simulation situations: stripe artifacts, Moer artifacts and Nyquist artifacts, and then reconstructing images with artifacts.

Step 3, simulating susceptibility artifacts, including: constructing a susceptibility model based on the normal EPI sequence images without artifacts, reconstructing a magnetic field distribution, and then reconstructing images with distortion artifacts.

Further, for different types of K-space artifacts, three-dimensional inverse Fourier transform is performed on the normal EPI sequence images without artifacts obtained by scanning to obtain the K-space data.

Further, for K-space artifact simulation of stripe artifacts, a point is randomly selected in the obtained K-space, to increase a numerical value of the point to a random large value more than 100 times of a normal value, simulating the K-space where single data points are digitized incorrectly.

Further, for K-space artifact simulation of Moer artifacts, a phase coding line with a phase coding step intensity below 15% is randomly selected in the obtained K-space and then data of the phase coding line is lost, simulating instability of radio frequency coil gradients.

Further, for K-space artifact simulation of Nyquist artifacts, interlacing undersampling modification is performed in the K-space in a simulation generation manner, causing mismatch between odd and even echoes.

Further, for the acquired normal EPI sequence images without artifacts, firstly, regions of interest (ROIs) are sketched for three-dimensional images of the normal EPI sequence images without artifacts by manual sketching or automatic segmentation, and different tissues and air regions are segmented and identified; and a susceptibility distribution model is established by assigning corresponding susceptibility values to the ROIs of different tissues, and a field map is generated from a susceptibility map through a magnetic source-field distribution formula.

Further, for the simulated susceptibility artifacts, the K-space data obtained by magnetic resonance imaging measurement is ideally expressed as:

$$\mathrm{Signal}(m\Delta K_x, n\Delta K_y) = \int\int \rho(x,y) e^{i2\pi(m\Delta K_x x + n\Delta K_y y)} dx\, dy,$$

where $\Delta K_x = \tau_s$, $\Delta K_y = \gamma G_y \tau_y$, m and n represent the step lengths of different coding directions in a K-space, $\tau_s$ represents a frequency coding sampling interval, $\rho(x, y)$ represents the coordinate of a corresponding image space, $G_y$ represents a phase coding gradient, $\tau_y$ represents a phase coding sampling interval, $G_y \tau_y$ represents an envelope area of a phase coding bipolar pulse, and $\gamma$ is a magnetogyric ratio of hydrogen atom; when a spatial region of an imaged object is in an off-resonance state, additional phase information is introduced into the K-space; and when a local magnetic field variation is $\Delta B(x, y)$, the K-space data obtained from the EPI sequence images under each excitation is described by the following equation:

$$\begin{aligned}\mathrm{Signal}(m\Delta K_x, n\Delta K_y) &= \int\int \rho(x,y) e^{i2\pi(m\Delta K_x x + n\Delta K_y y)} \cdot e^{i\gamma\Delta B(x,y)(nt_{esp} + m\tau_s)} dx\, dy \\ &= \int\int \rho(x,y) e^{i2\pi[m\Delta K_x(x+\Delta B(x,y)/G_x) + n\Delta K_y(y+\Delta B(x,y)t_{esp}/G_y\tau_y)]} dx\, dy,\end{aligned}$$

where $G_x$ represents a frequency coding gradient and $t_{esp}$ represents an echo time interval, and a pixel originally located at (x, y) appears at (x', y') in a deformed image:

$$x' = x + \frac{\Delta B(x, y)}{G_x}$$

$$y' = y + \frac{\Delta B(x, y) t_{esp}}{G_y \tau_y}$$

An image distortion caused by dislocation of continuous pixels due to the local magnetic field variation is calculated according to above equations, thereby simulating the susceptibility artifacts.

In another aspect, the present disclosure further provides a system for simulating magnetic resonance echo-planar imaging artifacts. The system includes an image acquisition module, a K-space artifact simulation module and a susceptibility artifact simulation module.

The image acquisition module is configured to scan EPI sequences of an imaging target based on magnetic resonance imaging to obtain normal EPI sequence images without artifacts.

The K-space artifact simulation module is configured to perform simulate K-space artifacts, including: restoring K-space data based on the normal EPI sequence images without artifacts, and modifying the K-space data for three simulation situations: stripe artifacts, Moer artifacts and Nyquist artifacts, and then reconstructing images with artifacts.

The susceptibility artifact simulation module is configured to simulate susceptibility artifacts, including: constructing a susceptibility model based on the normal EPI sequence images without artifacts, reconstructing a magnetic field distribution, and then reconstructing images with distortion artifacts.

Compared with the traditional artifact simulation technology, the present disclosure has the following beneficial effects:

(1) The present disclosure has good scientificity, accuracy and interpretability. Traditional artifact simulation often modifies the image subjectively according to different manifestations of artifacts. However, this method often faces some problems, such as excessive subjectivity, distorted simulation results, single simulation results and so on, which makes the generated artifact pictures too blunt and cannot accurately restore the artifact form in the real scene. In the present disclosure, directly from the perspective of imaging principle, the K-space artifact simulation module can simulate the performance of the problems that are easy to occur in the magnetic resonance imaging system in the K-space. In this case, the simulated artifacts approaches the real clinical scanned images as far as possible. Further, from the perspective of the intrinsic characteristics of scanned tissue, the susceptibility artifact simulation module can explore the way that susceptibility difference changes the local magnetic field, and thereby calculate the degree of distortion. In this case, the simulation result is not only scientific and interpretable, but further greatly improves the accuracy of the simulation result.

(2) The method of the present disclosure has good universality. For MRI scanning of different tissues, such as brain, abdomen and joints, this method can be used for good artifact simulation. Due to the K-space artifact simulation and the susceptibility artifact simulation, for different artifact degrees, a large number of high-quality artifact data sets can be easily realized for a normal magnetic resonance image only by applying different parameters to the K-space disturbance position, disturbance degree, local magnetic field variation position and variation degree.

DESCRIPTION OF EMBODIMENTS

Figure 1:
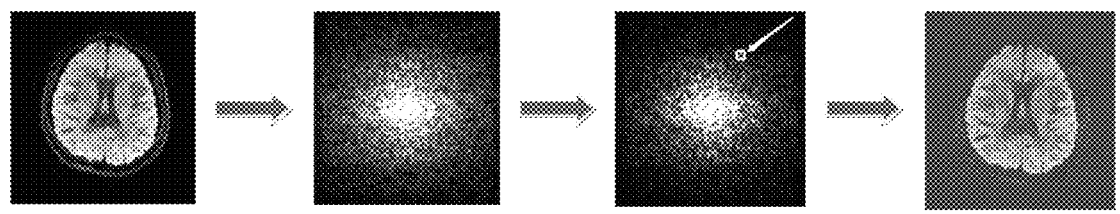
FIG. 1 is a simulation flow chart of stripe artifacts in brain magnetic resonance echo-planar imaging.

The present disclosure will be further described in detail with reference to the following specific examples and drawings. The process, conditions, experimental methods and the like of implementing the present disclosure are all common knowledge and common sense in this field, except for the contents specifically mentioned below, and the contents of the present disclosure are not particularly limited.

The present disclosure provides a method for simulating magnetic resonance echo-planar imaging artifacts based on the reconstruction principle of magnetic resonance echo-planar imaging sequences. In EPI sequence scanning, it is often found that abnormal artifacts are likely to appear in imaging, among which the most common artifacts are K-space reconstruction artifacts and susceptibility artifacts. These artifacts will affect people's judgment in clinic. In order to better understand the generation mechanism of EPI sequence artifacts and their influences on medical clinical application and scientific research, and to create a data set for further research on restoration of the artifacts in clinical or scientific research through deep learning, several methods for simulating the most common EPI artifacts are designed according to the principle of generation of EPI sequence artifacts.

For the simulation of K-space artifacts, the acquired normal EPI sequence images are subjected to inverse Fourier transform and other technologies to obtain a magnetic resonance K-space, and then artificial interference is applied to simulate the mode of generating real K-space artifacts, and finally the images with specific artifacts can be reconstructed. For the susceptibility artifacts, a susceptibility simulation model is constructed by the susceptibility differences of different brain tissues, and the susceptibility artifacts are simulated by the methods of susceptibility-field map calculation, image distortion calculation and other methods. This method can simulate the artifacts from the principle of artifact generation, so that the generated artifact images are almost consistent with those possibly appear in the situation of clinical scanning. The specific steps are as follows:

Step 1: Image Acquisition

A MRI system is configured to scan the EPI sequences of an imaging target, so as to obtain the normal EPI sequences without artifacts.

EPI sequence scanning experiments of healthy volunteers' brains were carried out on a 3T magnetic resonance imaging scanner (MAGNETOM Prisma, Siemens Medical, Germany). In the experiment, 64-channel head/neck coils were used to collect signals. The sequences and parameters used were standard Siemens clinical brain 3D-EPI sequences.

Step 2: K-Space Artifact Simulation

In magnetic resonance, K-space is a digital array, which is the dual space of an ordinary space under Fourier transform, and represents the spatial frequency information in magnetic resonance images. The gray value of each point in the K-space indicates the relative contribution of the spatial frequency to the final image.

Due to the limitation of the equipment itself or the change of environmental conditions in the process of magnetic resonance scanning, or the difference of patients' conditions and the design of the coding mechanism of the sequence itself, sometimes when collecting every frequency information in K-space, some information will be inadvertently lost or unreasonable information will be accidentally introduced, which will often affect the final generated magnetic resonance images, which are called K-space artifacts.

After obtaining the EPI sequence brain image data, the possible unfavorable factors in this K-space can be artificially simulated, and the stripe artifacts, Moer artifacts and Nyquist artifacts can be simulated by a magnetic resonance K-space reconstruction imaging method.

Figure 2:
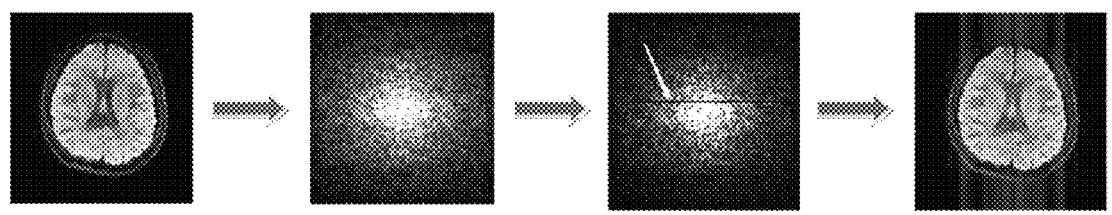
FIG. 2 is a simulation flow chart of Moer artifacts in brain magnetic resonance echo-planar imaging.
Figure 3:
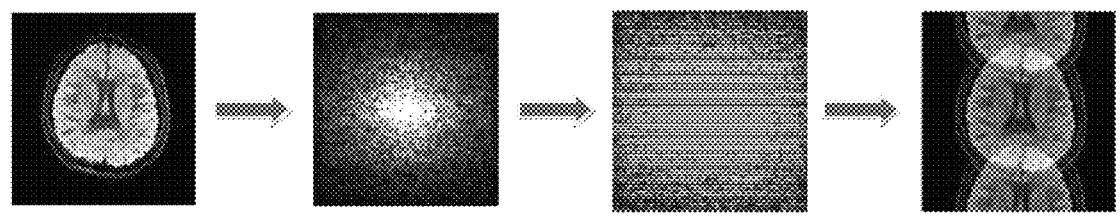
FIG. 3 is a simulation flow chart of Nyquist artifact in brain magnetic resonance echo-planar imaging.

FIG. 1, FIG. 2 and FIG. 3 show the flow charts of simulating stripe artifacts, Moer artifacts and Nyquist artifacts by a magnetic resonance K-space reconstruction imaging method, respectively. In the flow chart, from left to right, the first picture shows the normal image with no artifacts at first, the second picture shows the form of the normal image in the K-space after inverse Fourier transform, the third picture shows the processing modes for K-space data of the normal images for different artifacts, and the fourth picture shows the images with susceptibility artifacts reconstructed by Fourier transform in different K-spaces after processing.

2.1: The scanned normal EPI sequence images are read and inverse three-dimensional Fourier transform is carried out to obtain K-space data. The inverse discrete Fourier transform K of a 3D image matrix Img is defined as:

$$K_{p_k} = \sum_{j_1=1}^{m_1} \frac{1}{m_1} \omega_{m_1}^{p_1 j_1} \sum_{j_2=1}^{m_2} \frac{1}{m_2} \omega_{m_2}^{p_2 j_2} \sum_{j_3=1}^{m_3} \frac{1}{m_3} \omega_{m_3}^{p_3 j_3} Img_{j_k}, k=1,2,3,$$

where $K_{p_k}$ represents the information of the $k^{th}$ dimension in the K-space, and $p_k$ represents the $k^{th}$ dimension in the K-space, respectively; $Img_{j_k}$ represents the information of the $k^{th}$ dimension in the image domain, and $j_k$ represents the $k^{th}$ dimension in the image domain, respectively; $m_1$, $m_2$, and $m_3$ represent the lengths of respective dimensions; and $\omega_{m_1} = e^{2\pi i/m_1}$, $\omega_{m_2} = e^{2\pi i/m_2}$, and $\omega_{m_3} = e^{2\pi i/m_3}$ represent the complex unit roots of respective dimensions, respectively, where i is an imaginary unit.

2.2: Stripe artifacts are produced at a wrong data point in the K-space, which will bring stripes in different directions in the final imaged image. These stripes can be oriented in any direction: horizontal, vertical, oblique, etc., and there is any spacing between stripes. At the same time, such stripes may be serious or hardly attract people's attention, depending on where the bad data points in the original data fall and the degree of errors. Therefore, for the K-space simulation of stripe artifacts, a point is randomly selected in the obtained K-space, so that its numerical value becomes a random large value more than 100 times of a certain normal value, thus simulating the K-space where singular data points are digitized incorrectly; the loss of one or more rows of data in the K-space will cause artifacts in different degrees, among which the loss of 15% rows of data in the center will produce the largest artifact. Therefore, for K-space simulation of Moer artifacts, a phase coding line whose phase coding step intensity is below 15% may be randomly selected in the obtained K-space and then its data is caused to be lost, thus simulating the situation with unstable gradient of a RF coil; the famous Nyquist artifacts can be caused by many possible sources, including poor shimming, gradient coil heating, patient motion, receiver filter asymmetry, local field variation and reconstruction errors. For example, under the action of rapidly changing gradient pulse, eddy currents are induced in the coil and magnet shell, which in turn will produce local fields, which will change the total magnetic field and make the data phase shift. In EPI sequences, such artifacts are very common, and the main reason is related to its unique sampling trajectory. The EPI sequence usually has a zigzag sampling trajectory in the K-space, and an echo is generated every time it crosses a line of the K-space, and acquisition is performed every other echo in the other direction. In order to reconstruct the image, even echoes must be time reversed to match odd echoes before Fourier transform. If the forward and backward echoes are not perfect mirror images of each other, Nyquist artifacts will be introduced into image processing. Even a simple delay at the beginning of the first echo will propagate to all subsequent echoes, resulting in a slight time difference between the peaks of odd and even echoes. Therefore, for K-space simulation of Nyquist artifacts, they can be modified in the K-space by imitating the way they are generated, so that the odd and even echoes thereof do not match. Specifically, the K-space simulation of Nyquist artifacts can be carried out by deleting or weakening the data every other line or every multiple lines in the K-space, so that the forward and backward echoes are not perfect mirror images of each other, and thus Nyquist artifacts can be simulated in the K-space.

2.3: The modified K-space data is reconstructed into image data by three-dimensional Fourier transform, and the obtained image data is the simulated image corresponding to the artifact. The discrete Fourier transform Img of the 3D K-space data matrix K is defined as:

$$Img_{j_k} = \sum_{j_1=0}^{m_1-1} \omega_{m_1}^{p_1 j_1} \sum_{j_2=0}^{m_2-1} \omega_{m_2}^{p_2 j_2} \sum_{j_3=0}^{m_3-1} \omega_{m_3}^{p_3 j_3} K_{p_k},$$

where $Img_{j_k}$ represents the information of the $k^{th}$ dimension in the image domain; $K_{p_k}$ represents the information of the $k^{th}$ dimension in the K-space; $m_1$, $m_2$, and $m_3$ represent the lengths of respective dimensions, respectively, and $\omega_{m_1} = e^{2\pi i/m_1}$, $\omega_{m_2} = e^{2\pi i/m_2}$, and $\omega_{m_3} = e^{2\pi i/m_3}$ represent the complex unit roots of respective dimensions, respectively, where i is an imaginary unit.

Step 3: Susceptibility Artifact Simulation

Different susceptibility of adjacent tissues, such as air-tissue interface or bone-tissue interface, and pathological changes of tissues, such as bleeding and iron deposition, will cause local magnetic field unevenness. When the paramagnetic susceptibility of atoms and molecules of a tissue or material is expressed by $\chi_m$, its magnetization intensity is $M = \chi_m H_0$ in the main magnetic field $B_0 = \mu_0 H_0$, where $B_0$ represents the magnetic induction intensity of the main magnetic field, $\mu_0$ is the permeability of vacuum, $H_0$ is the magnetic field intensity of the main magnetic field. It should be noted that the magnetization intensity $\chi_m$ here does not refer to the magnetization intensity f the hydrogen nucleus in a human body, but represents the atom-level and molecular-level susceptibility caused by the different motion states of electrons outside the nucleus. It is mainly the susceptibility $\chi_m$ contributed by paramagnetic ions in tissues or implanted materials, such as iron ions ($Fe^{3+}$, $Fe^{2+}$), gadolinium (Gd), cupric ions ($Cu^{2+}$), manganese ions ($Mn^{2+}$), etc. This susceptibility is 4-5 orders of magnitude higher than that of the nucleus, ranging from several ppm to more than ten ppm. If bleeding occurs locally, the iron ions in the bleeding area will have abnormal aggregation density, which will lead to a great change in the susceptibility $\chi_m$. Sequences that are sensitive to the inhomogeneity of the main magnetic field $B_0$, such as EPI sequences, suffer from susceptibility artifacts far more seriously than other sequences.

Figure 4:
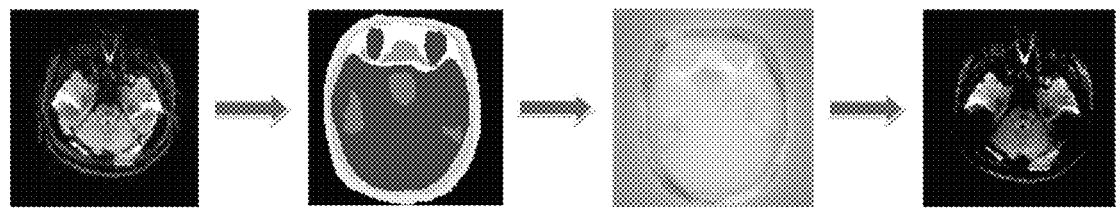
FIG. 4 is a simulation flow chart of susceptibility artifacts in brain magnetic resonance echo-planar imaging.

Through the obtained image information, the susceptibility model is constructed, and the local magnetic field change is calculated, so as to perform artifact stimulation for the image distortion caused by the magnetic field change. FIG. 4 shows the simulation flow chart of susceptibility artifacts in brain magnetic resonance echo-planar imaging of this embodiment, in which, from left to right, the first picture shows the normal image without artifacts at first, the second picture shows the established susceptibility model, the third picture shows the field map obtained by the magnetic source-field distribution formula, and the fourth picture shows the calculated image with susceptibility artifacts.

3.1: Constructing a susceptibility model. Taking brain magnetic resonance imaging as an example, firstly, the three-dimensional images of EPI sequences are segmented and identified according to different tissues and air regions, and the Region of Interest (ROI) can be sketched manually or automatically. For example, ITK-SNAP software can be configured to semi-automatically sketch and determine the Regions of Interest (ROIs) of different tissues or different components. According to the research results of prior normal human tissue susceptibility, the ROIs of different tissues are given corresponding susceptibility values. Taking free water as a reference, the ROI and susceptibility values of the main components of the brain include brain tissue (a relative susceptibility of 0.2), ear canal and nasal cavity (a relative susceptibility of 9.4), air in the external area (a relative susceptibility of 9.4), forehead cavity (a relative susceptibility of 7), skull (a relative susceptibility of −2.1), epidermis and subcutaneous fat (a relative susceptibility of 0.65), eyeball (a relative susceptibility is 0.1) and other tissues such as cerebrospinal fluid (cerebrospinal fluid) with a relative susceptibility of 0. At this time, artificially enlarging some special areas (such as cavities) or introducing strong susceptibility substances (such as dental implant metal trays) can establish the susceptibility model for the conditions of susceptibility artifacts.

Figure 5:
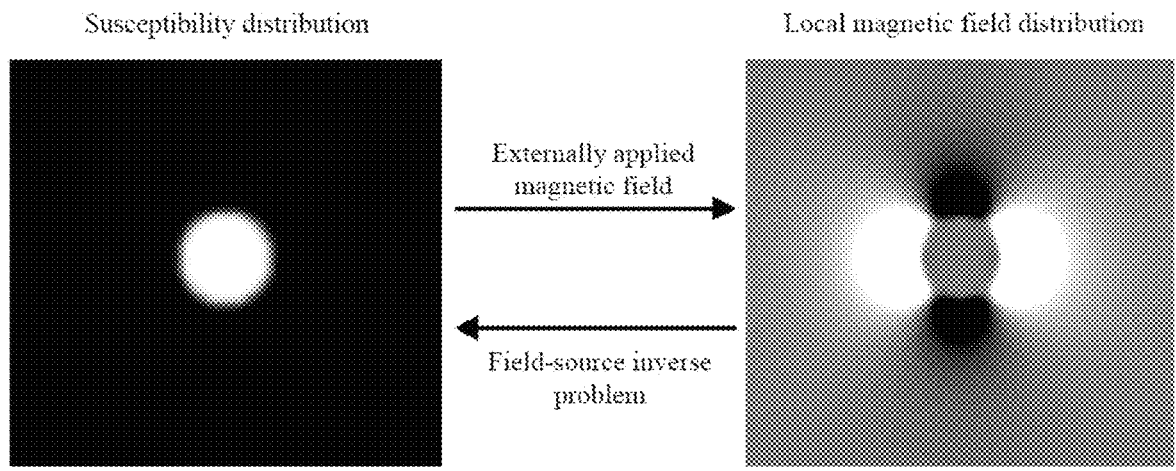
FIG. 5 is a schematic diagram of the local magnetic field distribution of a single magnetic source in a magnetic field.

3.2: FIG. 5 shows the principle diagram of the susceptibility distribution of a certain magnetic source to the local magnetic field distribution. A susceptibility map is generated into a field map by a magnetic source-field distribution formula. Taking the commonly used clinical 3.0T magnetic resonance imaging system as an example, the main magnetic field intensity is set to 3.0T, and the main magnetic field direction is set to the Z axis.

The magnetic source-field distribution formula is:

$$\Delta B(r) = \int_{r \neq r'} \chi(r') \frac{3\cos^2(\theta_{rr'} - 1)}{4\pi |r' - r|^3} d^3 r' = \frac{3\cos^2(\theta_r - 1)}{4\pi r^3} \otimes \chi(r),$$

where $$\Delta B(r) = \frac{B(r) - B_0}{B_0},$$

B(r) represents the magnetic induction intensity of an observation point, $\chi(r)$ represents the susceptibility distribution of the observation point, r represents the location of the observation point, r' represents the position of the susceptibility source point, $\chi(r')$ represents the susceptibility distribution of the susceptibility source point, $\theta_{rr'}$ represents the included angle between the direction r'-r and the applied magnetic field direction, and $\otimes$ represents a convolution operation.

3.3: Simulation of susceptibility artifacts. Because the bandwidth of the EPI sequence phase coding direction is much smaller than that of the conventional sequence, the image will be distorted in an area with an off-resonance effect, for example the local change of the simulated magnetic field in the method of the present disclosure. Ideally, the K-space data measured by magnetic resonance imaging can be expressed as:

$$\text{Signal}(m\Delta K_x, n\Delta K_y) = \int \int \rho(x, y) e^{i2\pi(m\Delta K_x x + n\Delta K_y y)} dx\, dy,$$

where $\Delta K_x = \tau_s$, $\Delta K_y = \gamma G_y \tau_y$, m and n represent the step lengths of different coding directions in the K-space, $\tau_s$ represents the frequency coding sampling interval, $\rho(x, y)$ represents the coordinate of a corresponding image space, $G_y$ represents a phase coding gradient, $\tau_y$ represents a phase coding sampling interval, $G_y \tau_y$ represents an envelope area of a phase coding bipolar pulse, and $\gamma$ represents a magnetogyric ratio of hydrogen atom. When a certain spatial region of an imaged object is in an off-resonance state, and at this time, additional phase information is introduced into the K-space; and when a local magnetic field variation is $\Delta B(x, y)$, the K-space data obtained from the EPI sequence images under each excitation is described by the following equation:

where $G_x$ represents a frequency coding gradient and $t_{esp}$ represents an echo time interval.

It is not difficult to find that the pixel originally located at the position (x, y) will appear at the position (x', y') in the deformed image:

$$x' = x + \frac{\Delta B(x, y)}{G_x}$$

$$y' = y + \frac{\Delta B(x, y) t_{esp}}{G_y \tau_y}$$

At this time, because the readout gradient is relatively large, the displacement x' along the frequency coding direction can often be ignored, therefore only the displacement y' in the phase coding direction can be considered in the processing of simulated susceptibility artifacts.

After obtaining the generated field map, the image distortion caused by the dislocation of continuous pixels caused by local magnetic field change can be well calculated by the above formula. Specifically, for each pixel, distortion calculation is performed for each pixel, and the pixel at coordinates (x, y) in the normal image is distorted and dislocated to coordinate (x, y') by simulation calculation, so as to simulate the susceptibility artifacts.

Figure 6:
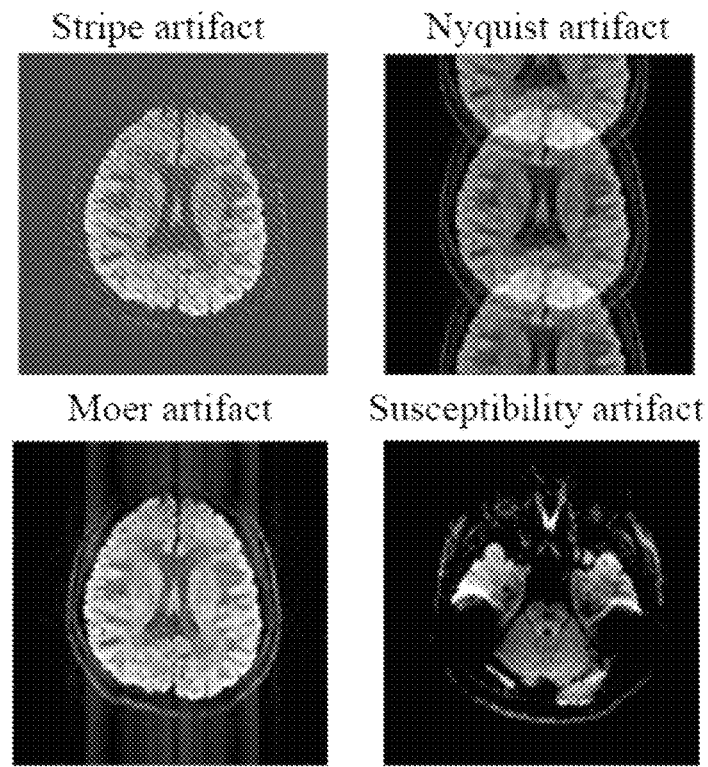
FIG. 6 is an example of the simulation results of different types of artifacts in brain magnetic resonance echo-planar imaging.

FIG. 6 shows the simulation results of different types of artifacts in the echo-planar imaging of brain magnetic resonance. The results show that the present disclosure can generate various common artifact types in clinical magnetic resonance echo-planar imaging. This is helpful for doctors to better identify the types of errors when they encounter abnormal images through diffusion-weighted imaging, blood oxygen fraction imaging and other clinical techniques, so as to correctly take measures such as shimming and radio-frequency stability. At the same time, the simulation results show that a large number of high-quality artifact data sets can be created by using the present disclosure, thus providing data basis for various machine learning algorithms related to artifact correction.

On the other hand, the present disclosure further provides a system for stimulating magnetic resonance echo-planar imaging artifacts, which includes an image acquisition module, a K-space artifact simulation module and a susceptibility artifact simulation module.

The image acquisition module is configured for scanning EPI sequences of an imaging target based on magnetic resonance imaging, so as to obtain normal EPI sequence images without artifacts. Reference may be made to the steps of the method for stimulating magnetic resonance echo-planar imaging artifacts provided by the present disclosure for the specific implementation process of this module.

The K-space artifact simulation module is configured for performing K-space artifact simulation; restoring K-space data based on the normal EPI sequence images without artifacts, and modifying the K-space data for three simulation situations: stripe artifacts, Moer artifacts and Nyquist $$\text{Signal}(m\Delta K_x, n\Delta K_y) = \int \int \rho(x, y) e^{i2\pi(m\Delta K_x x + n\Delta K_y y)} \cdot e^{i\gamma \Delta B(x,y)(nt_{esp} + m\tau_s)} dx\, dy$$

$$= \int \int \rho(x, y) e^{i2\pi[m\Delta K_x(x + \Delta B(x,y)/G_x) + n\Delta K_y(y + \Delta B(x,y)t_{esp}/G_y \tau_y)]} dx\, dy,$$

artifacts, and then reconstructing images with artifacts. Reference may be made to the steps of the method for stimulating magnetic resonance echo-planar imaging artifacts provided by the present disclosure for the specific implementation process of this module.

The susceptibility artifact simulation module is configured for performing susceptibility artifact simulation; constructing a susceptibility model based on the normal EPI sequence images without artifacts, reconstructing a magnetic field distribution, and then reconstructing images with distortion artifacts; reference may be made to the steps of the method for stimulating magnetic resonance echo-planar imaging artifacts provided by the present disclosure for the specific implementation process of this module.

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The above-mentioned embodiments are used to explain the present disclosure, but not to limit it. Any modification and change made to the present disclosure within the scope of protection of the spirit and claims of the present disclosure shall fall within the scope of protection of the present disclosure.

What is claimed is:

1. A method for simulating magnetic resonance echo-planar imaging artifacts, comprising:
   step 1, acquiring, by a magnetic resonance imaging (MRI) scanner, normal EPI Echo-planar Imaging (EPI) sequence images without artifacts, comprising:
   scanning EPI sequences of an imaging target based on magnetic resonance imaging to obtain the normal EPI sequence images without artifacts;
   step 2, simulating, by an MRI image post-processing device, K-space artifacts, comprising:
   restoring K-space data based on the normal EPI sequence images without artifacts,
   modifying the K-space data for three simulation situations: stripe artifacts, Moer artifacts and Nyquist artifacts, and
   reconstructing images with artifacts; and
   step 3, simulating, by the MRI image post-processing device, susceptibility artifacts, comprising:
   constructing a susceptibility model based on the normal EPI sequence images without artifacts, reconstructing a magnetic field distribution,
   reconstructing images with distortion artifacts;
   wherein for the acquired normal EPI sequence images without artifacts, regions of interest (ROIs) are sketched for three-dimensional images of the normal EPI sequence images without artifacts by manual sketching or automatic segmentation, and different tissues and air regions are segmented and identified; and a susceptibility distribution model is established by assigning corresponding susceptibility values to the ROIs of different tissues, and a field map is generated from a susceptibility map through a magnetic source-field distribution formula; and
   wherein for the simulated susceptibility artifacts, the K-space data obtained by magnetic resonance imaging measurement is expressed as:

$$\text{Signal}(m\Delta K_x, n\Delta K_y) = \iint \rho(x, y) e^{i2\pi(m\Delta K_x x + n\Delta K_y y)} dx\, dy$$

where $\Delta K_x = \tau_s$, $\Delta K_y = \gamma G_y \tau_y$, m and n represent step lengths of different coding directions in a K-space, $\tau_s$ represents a frequency coding sampling interval, $\rho(x, y)$ represents a coordinate of a corresponding image space, $G_y$ represents a phase coding gradient, $\tau_y$ represents a phase coding sampling interval, $G_y \tau_y$ represents an envelope area of a phase coding bipolar pulse, and $\gamma$ represents a magnetogyric ratio of hydrogen atom; when a spatial region of an imaged object is in an off-resonance state, additional phase information is introduced into the K-space, and when a local magnetic field variation is $\Delta B(x, y)$, the K-space data obtained from the EPI sequence images under each excitation is described by a following equation:

$$\text{Signal}(m\Delta K_x, n\Delta K_y) = \iint \rho(x, y) e^{i2\pi(m\Delta K_x x + n\Delta K_y y)} \cdot$$
$$e^{i\gamma \Delta B(x,y)(nt_{esp} + m\tau_s)} dx\, dy$$
$$\iint \rho(x, y)$$
$$e^{i2\pi[m\Delta K_x(x + \Delta B(x,y)/G_x) + n\Delta K_y(y + \Delta B(x,y)t_{esp}/G_y \tau_y)]} dx\, dy$$

where $G_x$ represents a frequency coding gradient and $t_{esp}$ represents an echo time interval, and a pixel originally located at (x, y) appears at (x', y') in a deformed image:

$$x' = x + \frac{\Delta B(x, y)}{G_x}$$
$$y' = y + \frac{\Delta B(x, y) t_{esp}}{G_y \tau_y}, \text{ and}$$

calculating an image distortion caused by dislocation of continuous pixels due to the local magnetic field variation according to above equations to simulate the susceptibility artifacts, generating various common artifact types in clinical magnetic resonance echo-planar imaging to be presented to a radiologist through a screen of the MRI image post-processing device, helping the radiologist to accurately and quickly identify an error type when encountering an abnormal image in clinical technology, and providing a data support for subsequent artifact correction or image processing, or storing data about the generated artifact types in a medical database through a medical workstation for subsequent medical analysis and diagnosis, thereby providing more accurate MRI diagnosis results for human organs such as a brain, an abdomen, and joints in a medical image judgment.

2. The method for simulating magnetic resonance echo-planar imaging artifacts according to claim 1, wherein for different types of K-space artifacts, three-dimensional inverse Fourier transform is performed on the normal EPI sequence images without artifacts obtained by scanning to obtain the K-space data.

3. The method for simulating magnetic resonance echo-planar imaging artifacts according to claim 1, wherein for K-space artifact simulation of stripe artifacts, a point is randomly selected in the obtained K-space to increase a numerical value of the point to a random large value more than 100 times of a normal value, simulating the K-space where single data points are digitized incorrectly.

4. The method for simulating magnetic resonance echo-planar imaging artifacts according to claim 1, wherein for K-space artifact simulation of Moer artifacts, a phase coding line with a phase coding step intensity below 15% is randomly selected in the obtained K-space and then data of the phase coding line is lost, simulating instability of radio frequency coil gradients.

5. The method for simulating magnetic resonance echo-planar imaging artifacts according to claim 1, wherein for K-space artifact simulation of Nyquist artifacts, interlacing undersampling modification is performed in the K-space in a simulation generation manner, causing mismatch between odd and even echoes.

6. A system for implementing the method for simulating magnetic resonance echo-planar imaging artifacts according to claim 1, wherein the system comprises an image acquisition module, a K-space artifact simulation module and a susceptibility artifact simulation module;

wherein the image acquisition module is configured to scan EPI sequences of an imaging target based on magnetic resonance imaging to obtain normal EPI sequence images without artifacts;

wherein the K-space artifact simulation module is configured to simulate K-space artifacts, comprising: restoring K-space data based on the normal EPI sequence images without artifacts, and modifying the K-space data for three simulation situations: stripe artifacts, Moer artifacts and Nyquist artifacts, and reconstructing images with artifacts; and wherein the susceptibility artifact simulation module is configured to simulate susceptibility artifacts, comprising: constructing a susceptibility model based on the normal EPI sequence images without artifacts, reconstructing a magnetic field distribution, and reconstructing images with distortion artifacts.

* * * * *